United States Patent [19]

Ebel

[11] Patent Number: 4,663,740
[45] Date of Patent: May 5, 1987

[54] HIGH SPEED EPROM CELL AND ARRAY

[75] Inventor: Mark S. Ebel, Los Altos, Calif.

[73] Assignee: Silicon Macrosystems Incorporated, San Jose, Calif.

[21] Appl. No.: 750,261

[22] Filed: Jul. 1, 1985

[51] Int. Cl.[4] ............................................. G11C 11/34
[52] U.S. Cl. .................................... 365/185; 365/189; 357/23.5
[58] Field of Search ....................... 365/182, 185, 189; 357/23.5

[56] References Cited

U.S. PATENT DOCUMENTS 4,402,064 8/1983 Arakawa ............................. 365/185

Primary Examiner—Joseph A. Popek
Attorney, Agent, or Firm—Flehr, Hohbach, Test, Albritton & Herbert

[57] ABSTRACT

A high speed EPROM cell comprises two floating gate field effect transistors and one field effect transistor. One of the floating gate transistors is smaller than the other floating gate transistor and functions as a programming transistor in developing charge on the interconnected floating gates. The larger dimensions of the other floating gate transistor allows increased read current and operating speed. The field effect transistor connects the larger floating gate transistor to a read drain terminal. The cell is readily fabricated using two doped polycrystalline semiconductor lines and two metallization lines in accordance with conventional semiconductor processing techniques.

12 Claims, 6 Drawing Figures

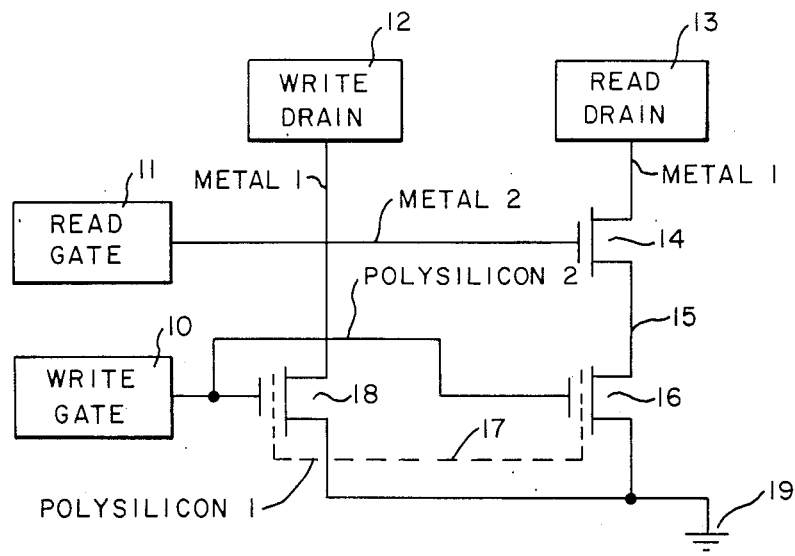
FIG.—1
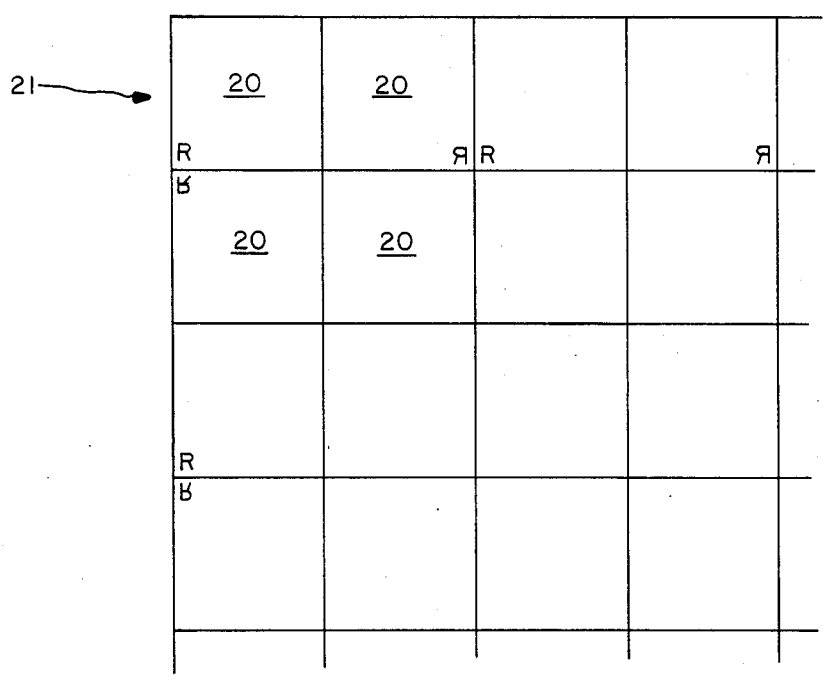
FIG.—2

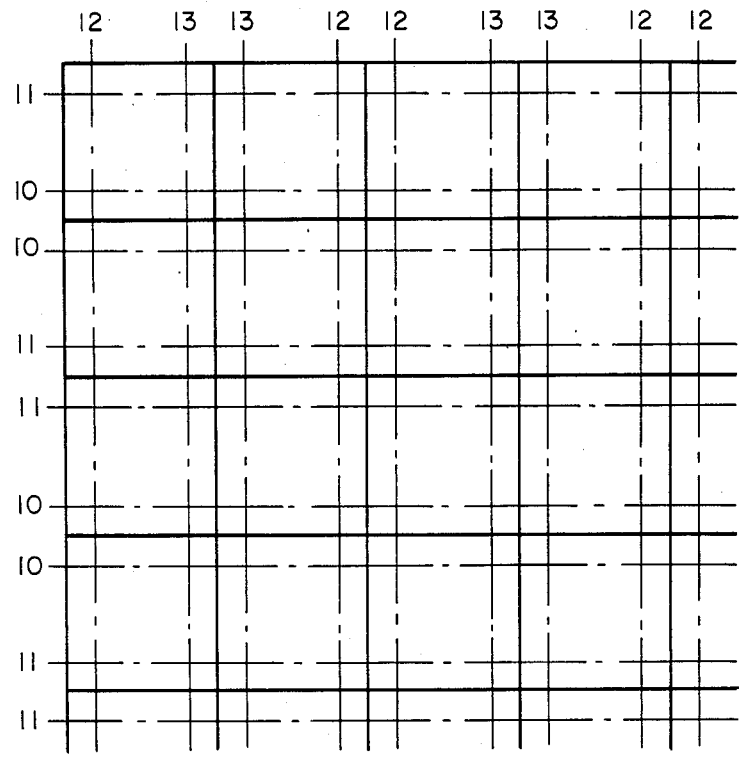
FIG.—3
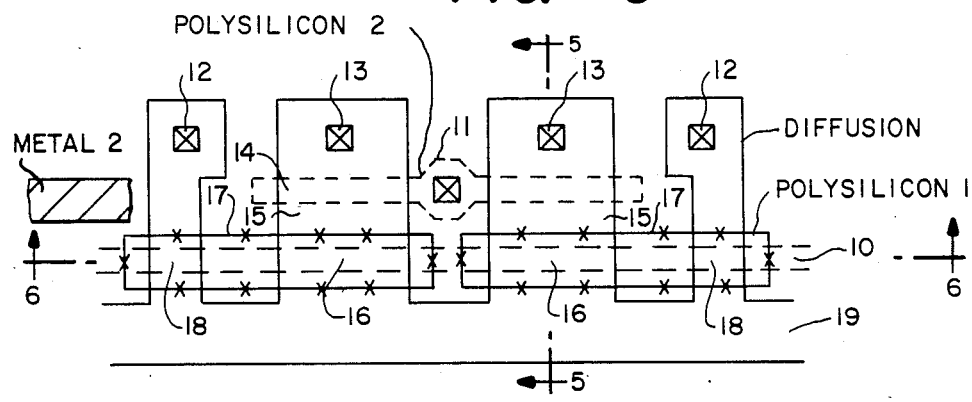
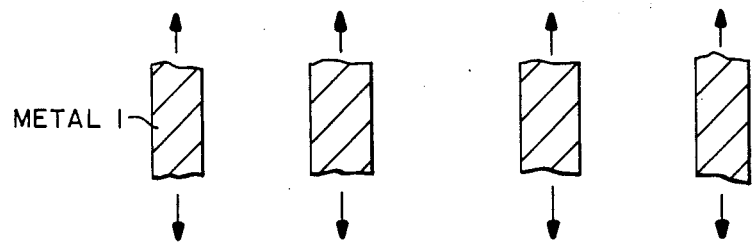
FIG.—4

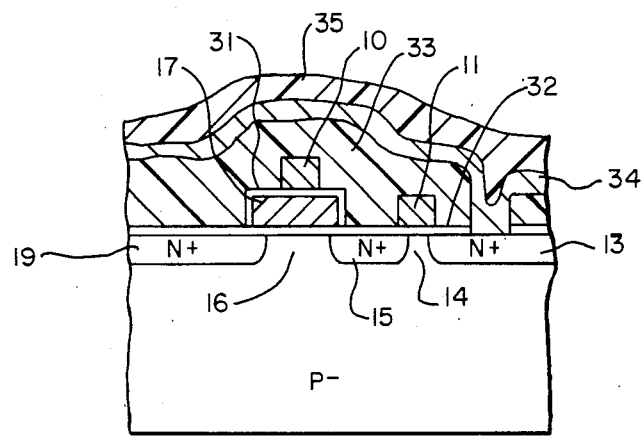
FIG.—5
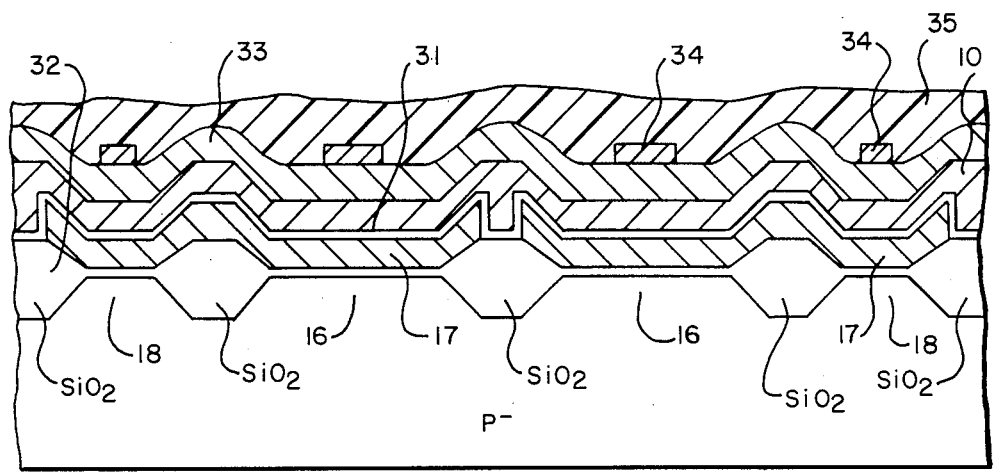
FIG.—6

HIGH SPEED EPROM CELL AND ARRAY

BACKGROUND OF THE INVENTION

This invention relates generally to semiconductor memory devices, and more particularly the invention relates to a high speed electrically programmable read-only memory (EPROM) cell and array.

The EPROM array typically employs a single floating gate transistor memory cell. In present technologies an EPROM cell measures approximately 6 microns by 6 microns with the transistor width and length being approximately 1.5 micron and 2 microns, respectively. This small cell size allows the fabrication of large memory arrays (e.g. 512K memories), and requires a small programming current. A major disadvantage, however, is the low cell current and consequent slow speed (e.g. 200-450 nanoseconds). Additionally, high voltage thresholds are required for device operation. Thus the conventional EPROM cell is suitable for high density applications but cannot complete with high speed bipolar memories. While merely making the conventional cell larger would increase read current and speed, the required programming current would be unacceptably large, and the threshold voltage of the unprogrammed transistor would remain unchanged.

SUMMARY OF THE INVENTION

An object of the present invention is an improved EPROM array and cell.

Another object of the invention is an EPROM array and cell having increased read current and operating speed.

Still another object of the invention is an EPROM device having a reduced operating voltage threshold.

Yet another object of the invention is an EPROM array structure which readily lends itself to conventional semiconductor processing techniques.

Briefly, the EPROM cell in accordance with the invention employs a first floating gate transistor and a second floating gate transistor with the floating gates of the two transistors being interconnected. The first floating gate transistor is smaller in size than the second floating gate transistor, and the threshold of the second transistor is preferably adjusted by means of ion implantation to reduce the threshold thereof. Thus in programming the cell charge is induced on the floating gate of the first transistor with the charge being communicated to the floating gate of the second transistor which is electrically connected thereto. A third field effect transistor is serially connected with the second floating gate transistor for determining the conductivity state of the transistor and thus the programming of the memory cell. Because of the large dimensions of the second transistor relative to the first transistor and the lower threshold voltage, increased read current is provided.

The EPROM array is readily fabricated using conventional semiconductor processing techniques with the floating gates and interconnection thereof comprising a first doped polycrystalline semiconductor layer, and the write gate terminal being interconnected to the gate electrodes of the firsst and second transistors by a second doped polycrystalline semiconductor layer. Programming and read output lines are provided by a first metallization layer, and a read gate line is provided by a second metallization layer.

The invention and objects and features thereof will be more readily apparent from the following detailed description and appended claims when taken with the drawings.

BRIEF DESCRIPTION OF THE DRAWINGS

FIG. 1 is a schematic of one embodiment of an EPROM cell in accordance with the present invention.

FIG. 2 is a schematic illustration of a portion of an EPROM array using the cell of FIG. 1.

FIG. 3 is a schematic of the portion of the array of FIG. 2 showing the location of interconnect lines.

FIG. 4 is a plan view of the layout of two adjacent cells in an integrated semiconductor circuit.

FIG. 5 is a section view of the integrated cell of FIG. 4 taken along the line 5—5.

FIG. 6 is a section view of the array portion of FIG. 4 taken along the line 6—6.

DETAILED DESCRIPTION OF ILLUSTRATIVE EMBODIMENTS

Referring now to the drawing, FIG. 1 is an electrical schematic of one embodiment of an EPROM cell in accordance with the invention. The cell includes a write gate 10, a read gate 11, a write drain 12, and a read drain 13. Read drain 13 is connected through a pass transistor 14, a common node 15, EPROM transistor 16, to circuit ground 19. Write drain 12 is connected through a write EPROM transistor 18 to circuit ground 19. The floating gates of transistors 16 and 18 are interconnected by conductor 17. The write gate 10 is connected to the gate electrodes of transistors 16 and 18, and the read gate 11 is connected to the gate of transistor 14.

During operation write gate 10 is maintained at $V_{cc}=5$ V during a read period, and during a write operation the gate 10 is connected to $V_{pp}=10$–25 volts for charging the floating gates of transistors 16 and 18. Read gate 11 is connected to $V_{cc}$ during read and to $V_{ss}=$ ground during a write operation. The write drain 12 is not used during read and is connected to $V_{pp}=10$–25 volts to program transistors 16 and 18 during a write operation. The read drain 13 is used to read current passing through EPROM transistor 16 and thus determine the programming of the cell. The read drain is not used during a write operation.

Pass transistor 14 is a field effect transistor configured for high read currents, and the transistor isolates the read drain contact 13 from the read EPROM transistor 16 except during a read operation. Transistor 14 is driven by the read gate 11 during a read operation.

The read EPROM transistor 16 is configured to provide a current on the order of 300 microamperes when not programmed, and the transistor provides no current when programmed by a charge on its floating gate. In one embodiment the transistor measures 5 microns in width and 1.8 microns in length.

The cell illustrated in FIG. 1 is readily programmed due to the small dimensions of EPROM transistor 18 yet provides a relatively high read current (e.g. 300 microamperes) due to the large width to length ratio and lower threshold voltage of transistor 16. Accordingly, the transistor can operate at much higher speeds than the conventional EPROM cell, and an EPROM array in accordance with the invention can function as a replacement for bipolar PROMS up to 64K bit memory size.

An EPROM array using the cell of FIG. 1 is readily fabricated in integrated form using two doped polycrystalline semiconductor connection layers and two metallization layers. FIG. 2 illustrates schematically a portion of an array using cells 20 shown schematically in FIG. 1. The letter R is placed in a corner of each cell to illustrate the relative positions of each cell in a column and in a row. For example, in row 21 the cells 20 are flipped from left to right as illustrated, and in the column 22 the cells are flipped from top to bottom as illustrated. FIG. 3 illustrates the same array portion with the center lines of conductors 12 and 13 running vertically and the center line of conductors 10 and 11 running horizontally to connect the rows and columns of cells. Write gate 10 comprises a doped polycrystalline semiconductor layer, and read gate 11 comprises a metallization layer. The write drain 12 and the read drain 13 comprise portions of a second metallization layer. The floating gates of transistors 16 and 18 along with the interconnection 17 (not shown) comprise the other doped polycrystalline semiconductor layer.

FIG. 4 is a plan view illustrating the layout of two adjacent cells in a semiconductor chip. The write gate interconnect 10 comprises a polycrystalline layer illustrated by dotted lines, write drain 12 and read drain 13 are provided in a first metallization layer, and the read gate 11 is provided on the second metallization layer. The floating gate of transistors 16 and 18 along with the interconnection 17 are provided by a first doped polycrystalline semiconductor layer.

The construction of the cells of FIG. 4 are further illustrated in the section views of FIGS. 5 and 6 which are taken along the lines 5—5 and 6—6, respectively, in FIG. 4. Referring to FIG. 5, the cell is fabricated in a P− doped silicon substrate with the transistors comprising N channel enhancement mode devices. Ground 19 and the source of transistor 16 comprise an N+ doped region. The drain of transistor 16, terminal 15, and source of transistor 14 comprise another N+ doped region, and the drain of transistor 14 and read drain contact 13 comprise yet another N+ doped region. The floating gate of transistor 16 and the interconnection 17 comprise a first doped polycrystalline layer, and the first gate of transistor 16 along with the interconnection to write gate 10 comprise a second doped polycrystalline semiconductor layer separated from the first doped polycrystalline semiconductor layer by oxide 31. The gate of transistor 14 comprises a polysilicon layer 11 with the gate region being separated from the substrate by an oxide layer 32. A metallization layer 34 is separated from the polysilicon 11 substrate by an oxide insulation layer 33 except at the read drain contact 13. A passivating silicon oxide layer 35 is formed on the surface of the device.

Referring to FIG. 6, the channel regions of transistors 16 and 18 comprise portions of the P− doped substrate underlying the silicon oxide layer 32 with the floating gates of transistors 16 and 18 and the interconnection 17 comprising the first doped polycrystalline semiconductor layer. The silicon oxide layer 31 separates the first doped polycrystalline semiconductor layer from the second doped polycrystalline semiconductor layer which comprises the write gate 10 and the gate electrodes of transistors 16 and 18. The passivating silicon oxide layer 35 covers oxide layer 33 and the second polycrystalline semiconductor layer 10.

The semiconductor integrated circuit is readily fabricated using conventional semiconductor processing techniques. Ion implantation is employed to adjust the threshold of the floating gates of transistors 16 and 18 and facilitate the programming of the floating gates and increase the current through the unprogrammed read transistor 16. EPROM layer 18 is a normal EPROM transistor with thresholds of widths and lengths optimized for efficient writing. EPROM transistor 16 is ion implanted to obtain a lower threshold than transistor 18, since it is not used in the write operations. Lower thresholds along with increased widths and decreased lengths provided for optimum read currents.

There has been described an improved EPROM field effect transistor cell and array which permits improved speed of operation that is compatible for use in replacing bipolar PROMS. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An electrically programmable memory (EPROM) cell comprising
 a first floating gate field effect transistor having a source region, a drain region, a channel region between said source region and said drain region, a first gate electrode spaced from said channel region, and a floating gate spaced between said first gate electrode and said channel region,
 a second floating gate field effect transistor having a source region, a drain region, a channel region between said source region and said drain region, a first gate electrode spaced from said channel region, and a floating gate spaced between said first gate electrode and said channel region,
 said first floating gate field effect transistor being smaller in dimensions than said second floating gate field effect transistor,
 a third field effect transistor having a source region, a drain region, a channel region between said source region and said drain region, and a gate electrode spaced from said channel region,
 means serially connecting said second and third transistors,
 means electrically interconnecting said floating gates of said first transistor and said second transistor,
 means electrically interconnecting said source regions of said first transistor and said second transistor to a common terminal,
 means connecting a write terminal to said first gate electrodes of said first transistor and said second transistor,
 means connecting a programming voltage terminal to said drain region of said first transistor,
 means connecting a read terminal to said gate electrode of said third transistor, and
 means connecting a read output terminal to said drain region of said third transistor.

2. The EPROM cell as defined by claim 1 wherein the width and length of said channel region of said first transistor are approximately 1 micron and 2 microns, and the width and length of said channel region of said second transistor are approximately 5 microns and 1.8 microns.

3. The EPROM cell as defined by claim 1 wherein said cell is integrated in a semiconductor body.

4. The EPROM cell as defined by claim 3 wherein said floating gates and said means electrically connecting said floating gates comprise a first doped polycrystalline semiconductor layer,
said means connecting a write terminal to said first gate electrodes comprises a second doped polycrystalline semiconductor layer;
said means connecting said programming voltage terminal to said drain region of said first transistor comprises a portion of a first metal layer,
said means connecting said read output terminal to said drain region of said third transistor comprises a portion of said first metal layer, and
said means electrically connecting said read terminal to said gate electrode of said third transistor comprises a second metal layer.

5. The EPROM cell as defined by claim 3 wherein said semiconductor body comprises a P− silicon body and said transistors are N channel enhancement mode.

6. The EPROM cell as defined by claim 5 wherein said width and length of said channel region of said first transistor are approximately 1 micron and 2 microns, and said width and length of said channel region of said second transistor are approximately 5 microns and 1.8 microns.

7. An electrically programmable read only memory (EPROM) array comprising
a plurality of memory cells, each memory cell including
a first field effect transistor having a source region, a drain region, a channel region between said source region and said drain region, a first gate electrode spaced from said channel region, and a floating gate spaced between said first gate electrode and said channel region,
a second field effect transistor having a source region, a drain region, a channel region between said source region and said drain region, a first gate electrode spaced from said channel region, and a floating gate spaced between said first gate electrode and said channel region,
said first field effect transistor being smaller in dimensions than said second field effect transistor,
a third field effect transistor having a source region, a drain region, a channel region between said source region and said drain region, and a gate electrode spaced from said channel region,
means serially connecting said second and third transistors,
means electrically interconnecting said floating gates of said first transistor and said second transistor,
means electrically interconnecting said source regions of said first transistor and said second transistor to a common terminal,
means connecting a write gate terminal to said first gate electrodes of said first transistor and said second transistor,
means connecting a programming voltage write drain terminal to said drain region of said first transistor,
means connecting a read gate terminal to said gate electrode of said third transistor, and
means connecting an output read drain terminal to said drain region of said third transistor, wherein said means connecting said read gate terminal and said gate terminal are parallel conductors and contact a plurality of serially aligned cells, and said means connecting said write drain terminal and said drain terminal are parallel conductors and contact a plurality of serially aligned cells, said read gate and write gate conductors being generally perpendicular to said read drain and write drain conductors.

8. The EPROM array as defined by claim 7 wherein the width and length of said channel region of said first transistor are approximately 1 micron and 2 microns, and the width and length of said channel region of said second transistor are approximately 5 microns and 1.8 microns.

9. The EPROM array as defined by claim 7 wherein said array is integrated in a semiconductor body.

10. The EPROM array as defined by claim 9 wherein said floating gates and said means electrically connecting said floating gates comprise a first doped polycrystalline semiconductor layer,
said means connecting a write gate terminal to said first gate electrodes comprises a second doped polycrystalline semiconductor layer,
said means connecting said programming voltage write drain terminal to said drain region of said first transistor comprises a portion of a first metal layer,
said means connecting said read output terminal to said drain region of said third transistor comprises a portion of said first metal layer, and
said means electrically connecting said read gate to said gate electrode of said third transistor comprises a second metal layer.

11. An EPROM cell comprising a first floating gate field effect transistor and a second floating gate field effect transistor, said first transistor being smaller than said second transistor, means electrically connecting the floating gates of said first and second transistors, a write terminal connected to gates of said first and second transistors, a programming voltage terminal connected to apply a programming voltage to said first transistor, a third field effect transistor serially connected with said second transistor for determining the programmed conductivity of said second transistor, and a read terminal connected through said third transistor to said second transistor.

12. The EPROM cell as defined by claim 11 wherein said cell comprises a portion of an integrated circuit memory array and wherein said floating gates comprise a first doped polycrystalline semiconductor layer, said gates of said first and second field effect transistor comprise a second doped polycrystalline semiconductor layer, said programming voltage terminal and said read terminal comprise portions of a first metal layer, and the gate terminal of said third field effect transistor comprises a second metal layer.

* * * * *